United States Patent
Fujita et al.

(10) Patent No.: US 8,358,727 B2
(45) Date of Patent: Jan. 22, 2013

(54) WIRELESS APPARATUS

(75) Inventors: Suguru Fujita, Tokyo (JP); Hideki Aoyagi, Miyagi (JP); Takenori Sakamoto, Tokyo (JP)

(73) Assignee: Panasonic Corporation, Osaka (JP)

( * ) Notice: Subject to any disclaimer, the term of this patent is extended or adjusted under 35 U.S.C. 154(b) by 964 days.

(21) Appl. No.: 12/438,094

(22) PCT Filed: Sep. 26, 2007

(86) PCT No.: PCT/JP2007/068724
§ 371 (c)(1),
(2), (4) Date: Feb. 19, 2009

(87) PCT Pub. No.: WO2008/072405
PCT Pub. Date: Jun. 19, 2008

(65) Prior Publication Data
US 2010/0239058 A1    Sep. 23, 2010

(30) Foreign Application Priority Data

Dec. 13, 2006  (JP) .................................. 2006-335737
Sep. 21, 2007  (JP) .................................. 2007-245829

(51) Int. Cl.
*H04L 7/00* (2006.01)
(52) U.S. Cl. ...................................................... 375/355
(58) Field of Classification Search ................... 375/257, 375/355, 371; 702/89
See application file for complete search history.

(56) References Cited

U.S. PATENT DOCUMENTS
5,056,121 A    10/1991    Ohta et al.
(Continued)

FOREIGN PATENT DOCUMENTS
JP    2-54622 A       2/1990
JP    2003-244026 A   8/2003
(Continued)

OTHER PUBLICATIONS
International Search Report for PCT/JP2007/068724.

*Primary Examiner* — Sam K Ahn
*Assistant Examiner* — Shawkat M Ali
(74) *Attorney, Agent, or Firm* — Pearne & Gordon LLP

(57) ABSTRACT

The present invention has an object to provide a wireless apparatus which is capable of correctly sampling a waveform of a pulse even when a shape of the pulse is varied.

A synchronizing apparatus for causing an input signal to be synchronized with a clock signal is equipped with sampling unit 102, 103, and delay control unit 112. The sampling unit 102 and 103 sample the input signal at first sampling timing and second sampling timing, which are separated from each other in a predetermined time interval. The delay control unit 112 shifts both the first and second sampling timing during synchronous pull-in operation, and also, narrows the interval between said first and second sampling timing during synchronous follow-up operation. A synchronous status judging unit 105 judges whether or not the input signal is synchronized with the clock signal based upon a phase error amount outputted from a phase error calculating unit 104, and outputs the synchronous status to a delay amount control unit 106. The delay amount control unit 106 controls to increase/decrease delay amounts which have been presently set in variable delay devices 107 and 108 based upon the phase error amount outputted from the phase error calculating unit 104 and the synchronous status outputted from the synchronous status judging unit 105.

12 Claims, 10 Drawing Sheets

U.S. PATENT DOCUMENTS

| | | | |
|---|---|---|---|
| 2001/0046266 A1* | 11/2001 | Rakib et al. | 375/259 |
| 2002/0080898 A1* | 6/2002 | Agazzi et al. | 375/355 |
| 2003/0067331 A1* | 4/2003 | Drexler | 327/158 |
| 2003/0193614 A1* | 10/2003 | Holland et al. | 348/441 |
| 2007/0024335 A1* | 2/2007 | Sato | 327/158 |
| 2008/0049850 A1* | 2/2008 | Sidiropoulos et al. | 375/257 |
| 2008/0091371 A1* | 4/2008 | Ishida et al. | 702/89 |

FOREIGN PATENT DOCUMENTS

| | | |
|---|---|---|
| JP | 2003-535552 A | 11/2003 |
| JP | 2003-101268 A | 4/2006 |
| JP | 2006-134501 A | 5/2006 |
| WO | 01/93441 A1 | 12/2001 |
| WO | 2006-112193 A1 | 10/2006 |

* cited by examiner

FIG. 5

ONE EXAMPLE OF TABLE

| DURING PULL-IN OPERATION (HIGH SPEED) | |
|---|---|
| INPUT VALUE | OUTPUT VALUE |
| 9~15 | 10 |
| 4~8 | 5 |
| 2~3 | 3 |
| −1~1 | 1 |
| −3~−2 | −3 |
| −8~−4 | −5 |
| −15~−9 | −10 |

| AFTER PULL-IN OPERATION (LOW SPEED) | |
|---|---|
| INPUT VALUE | OUTPUT VALUE |
| 10~15 | 3 |
| 5~9 | 2 |
| 2~4 | 1 |
| −1~1 | 0 |
| −4~−2 | −1 |
| −9~−5 | −2 |
| −15~−10 | −3 |

※ IN CASE THAT AD IS 4 BITS (0 TO 15)

(a)

(b)

Δt1 > Δt2

WIRELESS APPARATUS

TECHNICAL FIELD

The present invention is related to a wireless apparatus such as a synchronizing apparatus, which controls variable signal delaying unit based upon information acquired from data sampling unit so as to synchronize sampling timing with respect mainly to an inputted signal.

BACKGROUND ART

In high-speed wireless communication techniques for employing pulse communication systems which are typically known as UWB (Ultra Wide-Band), since linearity is not always required, wireless communication apparatuses may be suitably manufactured by utilizing CMOSs (Complementary Metal Oxide Semiconductors), and thus, may be made compact. Also, since RF circuits such as high-precision local signal sources are not required, wireless communication apparatuses are operable under low power consumption. Moreover, since wide bands are utilized, wireless communication apparatuses may realize high-speed communications.

However, although the wireless communication apparatuses have the above-described merits, since data sampling operations for pulse-shaped signals shorter than, or equal to 1 nsec are carried out, synchronous pull-in operations within short times are required and high-precision tracking operations are required, which constitute one of unrealizable problems thereof.

As conventional sample timing generating circuits for generating sample timing that is synchronized with respect to inputted signals, clock data recovery circuits constructed of analog components such as LPFs (Low-Pass Filters) and VCOs (voltage-Controlled Oscillators) have been provided (refer to, for example, patent publication 1).

Also, synchronizing apparatuses have been provided in which inputted signals are over-sampled, sampling timing errors are calculated from these over-sampled data, and phases (timing) of clocks generated by oscillators are adjusted, so that the generated clocks are synchronized with the inputted signal (refer to, for instance, patent publication 2).

FIG. 8 indicates an arrangement of the conventional clock data recovery circuit described in the above-described patent publication 1. Data produced by sampling an input signal "DIN" by a discriminator 1204 is compared with a signal produced by delaying the input signal "DIN" by a delay circuit 1201 by a phase comparator 1212 so as to generate pulses in response to phase errors.

Then, the generated pulses are averaged by an LPF 1206, and a voltage of the averaged pulse is amplified by a GCA (Gain Controlled Amplifier) 1207, and a clock signal having a frequency corresponding to this amplified voltage is generated by a VCO 1203. Since timing of the clock signal is adjusted by a variable phase shifter 1211 based upon the clock signal generated by the VCO 1203 and the timing-adjusted clock signal is supplied to the discriminator 1204, such a clock data recovery circuit capable of obtaining the extracted clock signal that is synchronized with the input signal DIN is arranged.

FIG. 9 indicates an arrangement of the conventional synchronizing apparatus described in the above-described patent publication 2. An input signal "xk" is sampled by an interpolator 1110, the sampled input signal "xk" is PR-equalized by a PR (Partial Response) equalizing unit 1111, and initial sampling timing (phase) is calculated by a ZPR (ZERO PHASE RESTART) 1115. Then, an NCO (Number Controlled Oscillator) 1114 is operated based upon a value obtained by averaging phase errors by an LPF 1113, and a clock produced by the NCO 1114 is applied to the interpolator 1110, so that the synchronizing apparatus capable of synchronizing the clock with the input signal "xk" is arranged. The phase errors are defined between the output of the ZPR 1115 and either the calculated value of the initial sampling timing or the output of the PR equalizing unit 1111 detected by the phase error detector 1112.

However, in the method for using the analog components such as the LPF and the VCO, the time constant becomes long, so that a lengthy time is required in the synchronous pull-in operation. Also, in the method for executing the over sampling process operation, since the synchronizing apparatus is arranged by the interpolator, the NCO (Number Controlled Oscillator), and the like, the arrangement thereof becomes complex. As a consequence, as synchronizing methods that are particularly specialized in pulse communications, the below-mentioned methods have been proposed which may track synchronizations by acquiring correlations among respective signals that have been delayed before and after a reference time (refer to, for instance, patent publication 3).

FIG. 10 is a block diagram for representing an arrangement of a conventional pulse wireless communication apparatus described in the patent publication 3. In FIG. 10, the conventional pulse wireless communication apparatus 1000 has been arranged by an amplifier 1002; a filter 1003; an analog coding unit 1004; splitters 1005 and 1015; a plurality of delaying devices 1006, 1007 and 1008; multipliers 1009, 1010 and 1011; integrators 1012, 1013, and 1014; a reception synchronizing control unit 1017; phase delaying unit 1018; and a main reception wavelet code producing device 1016. The amplifier 1002 amplifies an RF signal received by an antenna 1001. The filter 1003 eliminates an unnecessary signal. The analog coding unit 1004 converts the signal to an analog signal. The splitters 1005 and 1015 split the signals. The delaying devices 1006, 1007, and 1008 delay the signals. The multipliers 1009, 1010, and 1011 multiply the signals. The integrators 1012, 1013, and 1014 integrate times. The reception synchronizing control unit 1017 performs a synchronization judging operation and a delay control operation in response to correlations. The phase delaying unit 1018 delays a phase of a signal. The main reception wavelet code producing device 1016 modulates the phase-delayed signal, and spreads the modulated phase-delayed signal based upon the same spread codes.

With employment of this arrangement, the received RF signal is amplified by the amplifier 1002 so as to become such an RF signal having an amplitude required in a demodulation; an unnecessary frequency band thereof outside the relevant band is eliminated by the filter 1003; and then, an analog code is produced by the analog coding unit 1004. This signal is split by the splitter 1005, and then, 3 pieces of signals delayed by the delaying devices 1006, 1007, and 1008 are outputted. That is, a signal delayed by a time "L", a signal delayed by a time "L+Y", and a signal delayed by a time "L−Y" are outputted.

A reference pulse signal produced by the main reception wavelet code producing device 1016 is multiplied with respect to these three signals by the multipliers 1009, 1010, and 1011, respectively. Then, the multiplied pulse signals are integrated by times corresponding to the respective symbols by the integrators 1012, 1013, and 1014. The reception synchronizing control unit 1017 judges synchronizations in response to correlations among the respective signals, and outputs decoded data 1019, while the reception synchronizing control unit 1017 controls the phase delaying unit 1018 so as to perform the sliding synchronization.

At this time, while the reception pulse signal at the time "L" is defined as the reference of the correlation, in such a case that the correlation of the signal of the time "L+Y" becomes higher than that of the signal of the time "L", the phase delaying unit 1018 delays a tracking time period. Conversely, in such a case that the correlation of the signal of the time "L−Y" becomes higher than that of the signal of the time "L", since the phase delaying unit 1018 leads the tracking time period, the phases of the time-integrated signals are adjusted in such a manner that these time integrated signals are synchronized with the transmission symbol rate.

Patent Publication 1: JP-A-2006-101268
Patent Publication 2: JP-A-2006-134501
Patent Publication 3: JP-T-2003-535552 (page 148, FIG. 37A)

DISCLOSURE OF THE INVENTION

Problem that the Invention is to Solve

However, in the above-described conventional synchronizing method, the below-mentioned problem is present. That is, due to such a factor as a variation in communication distances and a variation in communication paths, when pulse amplitudes and pulse widths (pulse shapes) are varied, the pulse amplitudes can be hardly sampled at proper positions.

The present invention has been made of solving the conventional problem, and therefore, has an object to provide a wireless apparatus capable of correctly sampling waveforms of pulses even when shapes of the pulses are varied.

Means for Solving the Problems

A wireless apparatus, according to the present invention, is featured by comprising: a sampling unit for sampling an input signal in accordance with a plurality of different intervals from each other; a variable delaying device for changing the plurality of sampling intervals; a phase error calculating unit for calculating a phase error by employing an amplitude difference among a plurality of sampled values sampled by the sampling unit; a synchronous status judging unit for judging a synchronous status by employing the phase error calculated by the phase error calculating unit; and a delay amount control unit for changing a delay amount of the variable delaying device based upon both the phase error calculated by the phase error calculating unit and the synchronous status judged by the synchronous status judging unit.

In accordance with the above-described arrangement, since the sampling frequency can be increased in a quasi manner, the waveform can be correctly predicted. As a consequence, since the predicted waveform is employed, the input signal may be synchronized with the clock signal, and also, while the maximum amplitude thereof may be predicted, the transmission and reception operations may be controlled.

Also, in the wireless apparatus related to the present invention, the sampling unit samples the input signal at first sampling timing and second sampling timing, which are separated from each other in a predetermined interval; and the delay amount control unit shifts at least one of the first and second sampling timing during a synchronous pull-in operation, and narrows the interval between the first and second sampling timing during a synchronous follow-up operation.

In accordance with the above-described arrangement, even in such a case that the synchronous status is varied due to the variation in the pulse shapes, since the sampling timing and the interval there-between can be controlled in response to the synchronous statuses, the pulse amplitudes can be sampled at the proper positions. In other words, during the synchronous pull-in operation, at least one of the first sampling timing and the second sampling timing is shifted under such a condition that the sampling interval is wide, so that probability at which the sampling point is hit on a portion of the pulse can be increased. Also, during the synchronous follow-up operation, the sampling interval is narrowed and the sampling operation is carried out at such a point located in the vicinity of the synchronous point where the S/N becomes high, so that such an information that an adverse influence given to the amplitude due to the noise is decreased can be acquired.

Also, in the wireless apparatus related to the present invention, the sampling unit is comprised of: a first sampling unit for sampling the input signal at the first sampling timing; and a second sampling unit for sampling the input signal at the second sampling timing; and also, the variable delaying device is comprised of: a first variable delaying device for delaying a clock signal in response to a signal derived from the delay amount control unit so as to produce the first sampling timing; and a second variable delaying device for delaying the first sampling timing in response to a signal derived from the delay amount control unit so as to produce the second sample timing.

In accordance with the above-described arrangement, the first and second variable delaying devices for producing the first and second sampling timing in response to the signal derived from the delay amount control unit are provided, so that even when the pulse shape of the input signal is varied, the pulse widths can be sampled at the proper positions.

Also, in the wireless apparatus related to the present invention, the sampling unit samples the input signal at the first sampling timing and the second sampling timing separated from each other in the predetermined interval by thinning a sampling point.

In accordance with the above-described arrangement, a total number of the processing operations can be decreased by thinning the sampling point, so that the process operation with respect to the input signal can be more quickly commenced and accomplished.

Also, in the wireless apparatus related to the present invention, the phase error calculating unit calculates the phase error by detecting an amplitude difference between a first sampled value sampled by the first sampling unit, and a second sampled value sampled by the second sampling unit; and also, the delay amount control unit changes the delay amounts of the first and second variable delaying devices based upon the phase error calculated by the phase error calculating unit and the synchronous status judged by the synchronous status judging unit.

In accordance with the above-described arrangement, the time of the clock signal is shifted based upon the detected phase error so as to perform the synchronous pull-in operation, so that the time duration for the synchronous pull-in operation can be shortened. Also, the sampling interval is changed in response to the detected synchronous status, so that the synchronous jitter components produced during the follow-up operation after the synchronous pull-in operation can be reduced so as to advantageously stabilize the synchronization.

Also, in the wireless apparatus related to the present invention, the phase error calculating unit calculates the phase error by detecting an amplitude difference between the first sampled value sampled at the first sampling timing, and the second sampled value sampled at the second sampling timing; and also, the delay amount control unit changes at least any one of the first sampling timing and the second sampling timing based upon the phase error calculated by the phase error calculating unit and the synchronous status judged by the synchronous status judging unit.

In accordance with the above-described arrangement, the sampling timing is shifted based upon the detected phase error, so that the time duration for the synchronous pull-in operation can be shortened. Also, the sampling interval is changed in response to the detected synchronous status, so that the synchronous jitter component produced during the follow-up operation after the synchronous pull-in operation can be reduced so as to advantageously stabilize the synchronization.

Also, in the wireless apparatus related to the present invention, the phase error-calculating unit is comprised of a first table that is investigated so as to calculate the phase error.

In accordance with the above-described arrangement, the process operation for calculating the phase error can be carried out in a high speed by utilizing the first table.

Also, in the wireless apparatus related to the present invention, the synchronous status judging unit is comprised of a second table that is investigated so as to judge the synchronous state.

In accordance with the above-described arrangement, the process operation for judging the synchronous status can be carried out in a high speed by utilizing the second table.

Also, in the wireless apparatus related to the present invention, the delay amount control unit is comprised of a third table that is investigated so as to determine the delay amount.

In accordance with the above-described arrangement, the process operation for determining the delay amount can be carried out in a high speed by utilizing the third table.

Also, in the wireless apparatus related to the present invention, while the delay amount control unit is comprised of a plurality of waveform tables corresponding to a waveform of the input signal, the delay amount control unit predicts the waveform of the input signal so as to select a predetermined waveform table corresponding to the waveform of the input signal, and refers to the selected waveform table so as to control the first sampling timing and the second sampling timing.

In accordance with the above-described arrangement, the waveform of the input signal is predicted so as to select the proper waveform table, so that the sampling timing can be properly set in response to the waveform of the input signal so as to increase the synchronous precision. Alternatively, the deformation of the waveform may be predicted by utilizing the known signal portion of the input signal, and the waveform table may be changed based upon the predicted waveform deformation.

Also, in the wireless apparatus related to the present invention, during the synchronous follow-up operation, the delay amount control unit refers to the selected waveform table so as to narrow the interval between the first sample timing and the second sample timing.

In accordance with the above-described arrangement, the sampling interval is widened during the synchronous pull-in operation. As a result, the probability at which the sampling operation is performed at such a timing when the pulse is present can be increased. Also, the sampling interval is narrowed during the synchronous follow-up operation. As a result, the waveforms of the pulse can be sampled which are located near the maximum value of the pulse, so that the erroneous judgment caused by the noise can be avoided.

Also, in the wireless apparatus related to the present invention, the delay amount control unit is comprised of a waveform predicting unit which defines the amplitude information acquired at the first and second sampling timing as a parameter of the prediction.

In accordance with the above-described arrangement, the waveform is predicted based upon the plurality of amplitude information acquired for the synchronization purpose, so that the precision of the synchronization can be increased.

Also, in the wireless apparatus related to the present invention, the waveform predicting unit is arranged by: a waveform table storing unit for storing thereinto waveform information which has been previously prepared; a waveform reproducing unit for reproducing a prediction-purpose waveform based upon the amplitude information and temporal information of the input signal; a correlation acquiring unit for acquiring a correlation between the waveform information stored in the waveform table storing unit and the waveform reproduced by the waveform reproducing unit; and a waveform specifying unit for specifying a waveform based upon the correlative result obtained in the correlation acquiring unit so as to output table designation information for designating a table which is investigated in the delay amount control operation.

In accordance with the above-described arrangement, the waveform is predicted based upon the plurality of amplitude information acquired for the synchronization purpose, so that the precision of the synchronization can be increased.

Also, in the wireless apparatus related to the present invention, while the delay amount control unit is comprised of a plurality of waveform tables corresponding to a waveform of the input signal, the delay amount control unit predicts the waveform of the input signal so as to select a predetermined waveform table corresponding to the waveform of the input signal, and refers to the selected waveform table so as to control the first sampling timing and the second sampling timing and the second sampling timing; furthermore, the delay amount control unit is comprised of a waveform predicting unit which defines the amplitude information acquired at the first and second sampling timing as a parameter of the prediction; the waveform predicting unit is arranged by: a waveform table storing unit for storing thereinto waveform information which has been previously prepared; a waveform reproducing unit for reproducing a prediction-purpose waveform based upon the amplitude information and temporal information of the input signal; a correlation acquiring unit for acquiring a correlation between the waveform information stored in the waveform table storing unit and the waveform reproduced by the waveform reproducing unit; and a waveform specifying unit for specifying a waveform based upon the correlative result obtained in the correlation acquiring unit so as to output table designation information for designating a table which is investigated in the delay amount control operation; and also, the temporal information of the input signal is a delay amount when the clock signal is delayed by the first and second variable delaying devices.

In accordance with the above-described arrangement, the absolute time is not required, and the waveform can be predicted based upon the relative time.

Also, in the wireless apparatus related to the present invention, the waveform specifying unit changes a table to be selected in response to a sequence of the input signal.

In accordance with the above-described arrangement, in such a case that an input signal corresponds to such a specific sequence (data stream) by which it can be grasped that a phase thereof has been previously shifted, the shift can be corrected.

Also, the wireless apparatus related to the present invention is further comprised of reception power calculating unit for calculating reception power based upon the output result of the phase error calculating unit.

In accordance with the above-described arrangement, a magnitude of an input signal can be calculated based upon the calculation result of the phase error. For instance, the phase error calculation result may be utilized as information as to an AGC (Automatic Gain Control), and the like.

Also, in the wireless apparatus related to the present invention, the phase error calculating unit calculates the phase error based upon the first sampled values and the second sampled values, which have been sampled predetermined times; and the synchronous status judging unit judges the synchronous status every time the phase error calculating unit calculates the phase error.

In accordance with the present invention, after the sampled values have been measured plural times, the collected sampled value is employed in order to judge the synchronous status. As a result, a total judging time can be reduced, as compared with such judging times that every time the sampled value is measured, the phase error is calculated so as to judge the synchronous status.

Advantage of the Invention

In accordance with the present invention, even in such a case that the synchronous status is varied due to the variation of the pulse shapes, the sampling timing and the time intervals thereof can be controlled in response to the synchronous status, the pulse amplitudes can be sampled at the proper positions.

BRIEF DESCRIPTION OF THE DRAWINGS

FIG. 5 is a diagram for representing one example of a reference-purpose table provided in the synchronizing apparatus according to the embodiment mode 2 of the present invention.

Figure 1:
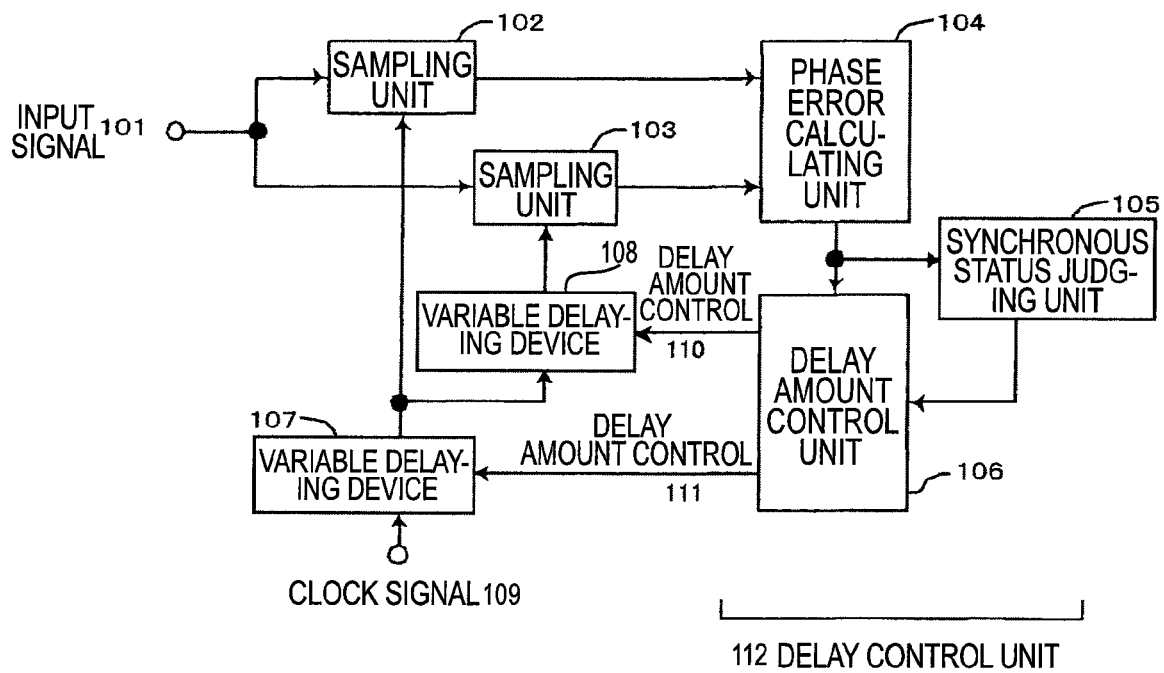
FIG. 1 is a block diagram for indicating an arrangement of a synchronizing apparatus according to an embodiment mode 1 of the present invention.

DESCRIPTION OF REFERENCE NUMERALS AND SIGNS 101 input signal
102, 103 sampling unit
104, 204 phase error calculating unit
105, 205 synchronous status judging unit
106, 206 delay amount control unit
107, 108, 207, 208 variable delaying device
109 clock signal
110, 111 delay amount control
112, 222 delay control unit
201 pulse input
202, 203 ND converter
209 1 GHz clock
210, 211 delay amount changing instruction
212 first sampling information
213 second sampling information
214 adder
215 phase error information
216 waveform table
217 reception waveform information
218 table selector
219 table selecting information
220 delay amount control table
221 synchronous status information
223 delay amount control information
301 waveform predicting unit (waveform table)
302 waveform table storing unit
303 correlation acquiring unit
304 waveform specifying unit
305 waveform reproducing unit
306 table designating information

BEST MODE FOR CARRYING OUT THE INVENTION

Referring now to drawings, a description is made of embodiment modes of the present invention.

Embodiment Mode 1

Figure 11:
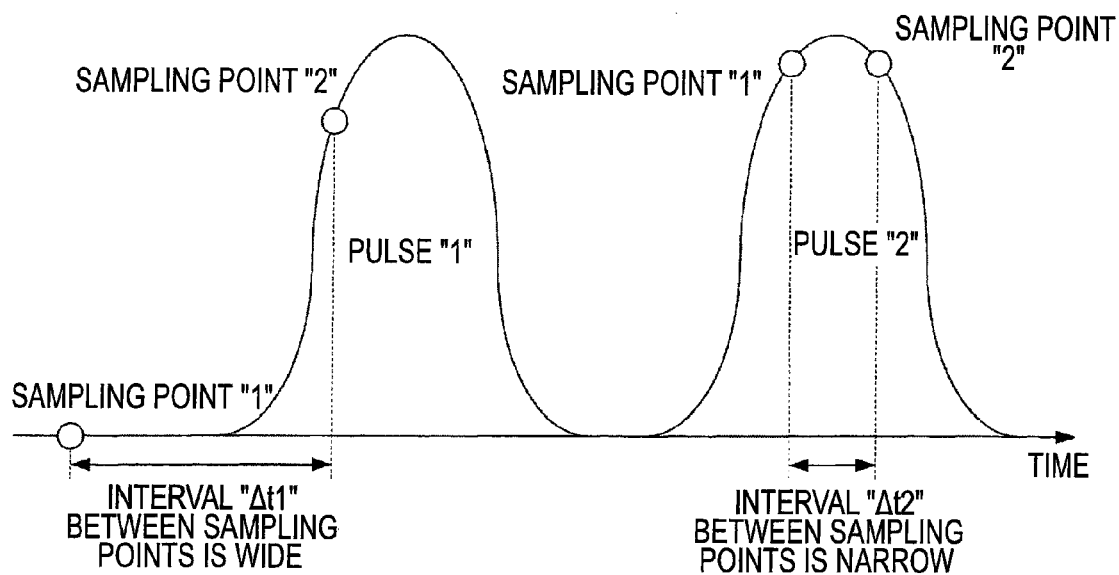
FIG. 11 is an explanatory diagram for explaining another operation example of the synchronizing apparatus according to the embodiment mode 1 of the present invention.

FIG. 11 is a diagram for showing operation of a synchronizing apparatus according to an embodiment mode 1 of the present invention. FIG. 1 is a block diagram of the synchronizing apparatus. In FIG. 11, sampling points "1" and "2" correspond to sampling positions of an amplitude in the synchronizing apparatus. While pulses "1" and "2" and the sampling positions have been described in the drawing, the pulse "1" indicates one example as to a sampling position during a synchronous pull-in operation, and the pulse "2" shows one example as to a sampling position under synchronous holding condition after the synchronous pull-in operation.

As disclosed in this example, an interval ($\Delta t1$) between the sampling points 1 and 2 during the synchronous pull-in operation is made wide, so that probability at which a sampling point is sampled at not such a timing (between pulse and pulse) that a pulse is not present, but at such a timing that the pulse is present can be increased. Also, under the synchronous holding condition, another interval ($\Delta t2$) is made narrow and is changed in such a manner that a sampling operation is carried out at a large amplitude, and also, is controlled in order to avoid an erroneous judgment caused by noise. As a result, the synchronizing operation can be carried out within a short time, and at the same time, the synchronizing operation can be carried out in high precision.

Referring now to FIG. 1, a description is made of a structural example of the synchronizing apparatus that performs this control operation. An input signal 101 is sampled by sampling unit 102 and 103 at respective timing, and then, respective sampled values are inputted to a phase error-calculating unit 104.

In the phase error-calculating unit 104, a phase error is calculated based upon the value sampled by the sampling unit 102 and the value sampled by the sampling unit 103, and then, the calculated phase error amount is outputted to a synchronous status judging unit 105 and a delay amount control unit 106. The synchronous status judging unit 105 judges whether or not a synchronization is established, and then, outputs the judged synchronous status to the delay amount control unit 106.

The delay amount control unit 106 controls to increase and/or decrease delay amounts which have been presently set to variable delaying devices 107 and 108 based upon the phase error amount outputted from the phase error calculating unit 104 and the synchronous status outputted from the synchronous status judging unit 105.

The variable delaying devices 107 and 108 delay a clock signal 109 in accordance with the delay amounts set by the delay amount control unit 106. The sampling unit 102 and 103 sample the input signal 101 based upon the clocks whose timing has been adjusted by the variable delaying devices 107 and 108.

Figure 2:
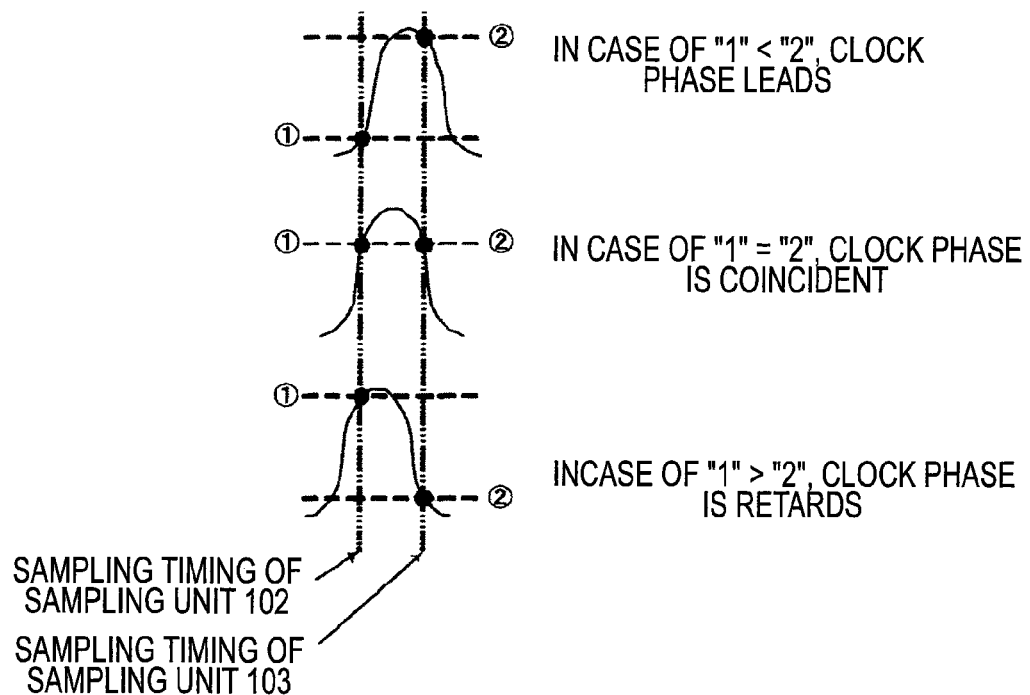
FIG. 2 is an explanatory diagram for explaining an operation example of the synchronizing apparatus according to the embodiment mode 1 of the present invention.

FIG. 2 is an explanatory diagram for explaining an operation example in the embodiment mode 1 of the present invention. The phase error calculating unit 104 judges whether present sampling timing by the clock signal leads, retards, or is coincident with respect to the input signal 101 based upon a large/small relationship between a sampled value (1) obtained by sampling the input signal 101 by the sampling unit 102, and a sampled value(2) obtained by sampling the input signal 101 by the sampling unit 103.

It should be understood that when there is substantially no difference between the sampled value (1) and the sampled value (2), the sampling timing is coincident with the input signal 101. Also, if the sampled value (2) is smaller than the sampled value (1), then the sampling timing retards with respect to the input signal 101. Furthermore, if the sampled value (2) is larger than the sampled value (1), then the sampling timing leads with respect to the input signal 101.

Figure 3:
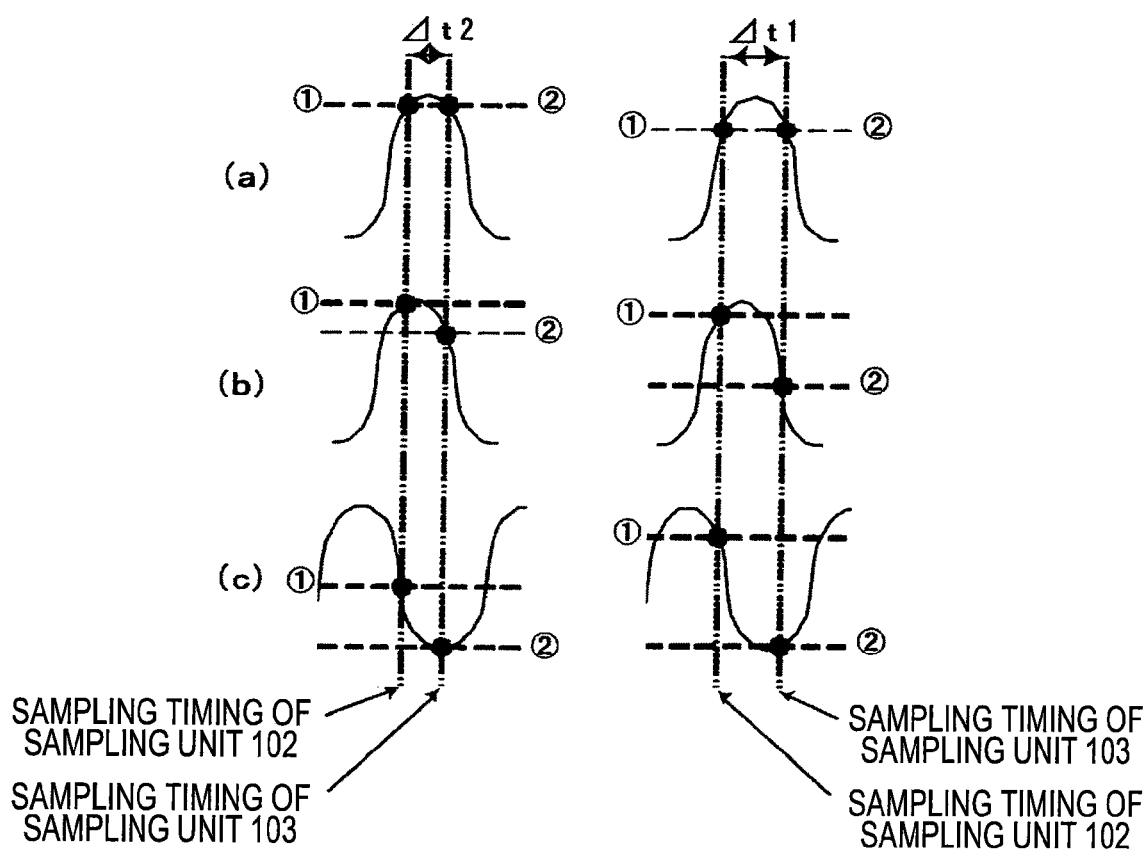
FIG. 3 is another explanatory diagram for explaining an operation example of the synchronizing apparatus according to the embodiment mode 1 of the present invention.

FIG. 3 explanatorily shows such a condition that a magnitude of a difference between the sampled value (1) obtained by sampling the input signal 101 by the sampling unit 102 and the sampled value (2) obtained by sampling the input signal 101 by the sampling unit 103 is largely changed based upon a delay amount of the clock signal by the variable delaying device 108.

In such a case that the input signal 101 is synchronized with the sampling timing, in (a) of FIG. 3, the sampled value (1) becomes substantially equal to the sampled value (2) irrespective of delay amounts ($\Delta t1$, $\Delta t2$) made by the variable delaying devices 108.

In such a case that the sampling timing retards with respect to the input signal 101, in (b) of FIG. 3 and (c) of FIG. 3, when a delay amount made by the variable delaying device 108 is larger ($\Delta t1 > \Delta t2$) than another delay amount, a difference between the sampled value (1) and the sampled value (2) becomes large. Since the difference between the sampled values becomes large with respect to the error of the sampling timing, even when the error of the sampling timing is small, the error of the sampling timing can be easily calculated, and the synchronous status can be easily judged. In other words, in such a case that the error of the sampling timing is small, since the difference of the sampling timing itself is small, there are some possibilities that the large/small relationship is erroneously judged. To the contrary, since the difference between the sampled value (1) and the sampled value (2) is large, if such sampled values whose difference is large are employed, then the large/small relationship can be hardly judged in an erroneous manner, and also, the leading/retarding statuses with respect to the synchronous position can be readily judged.

Also, since the difference between the sample values is large, such a possibility can be lowered that with respect to a waveform disturbance of the input signal 101 which is caused by noise and the like, the error contained in the sampling timing is calculated and the synchronous status is erroneously judged for the input signal 101. As a consequence, it is possible to avoid an execution of such a control operation that if the error of the sample timing is erroneously calculated, then the sampling error is increased.

Since such a possibility can be lowered that the error of the sample timing is erroneously calculated and the synchronous status is erroneously judged, the below-mentioned possibility may be increased, namely, such a control operation for decreasing the error of the sample timing may be carried out during initial synchronization (when synchronous pull-in operation is carried out). As a result, the synchronization can be established within a short time.

Figure 13:
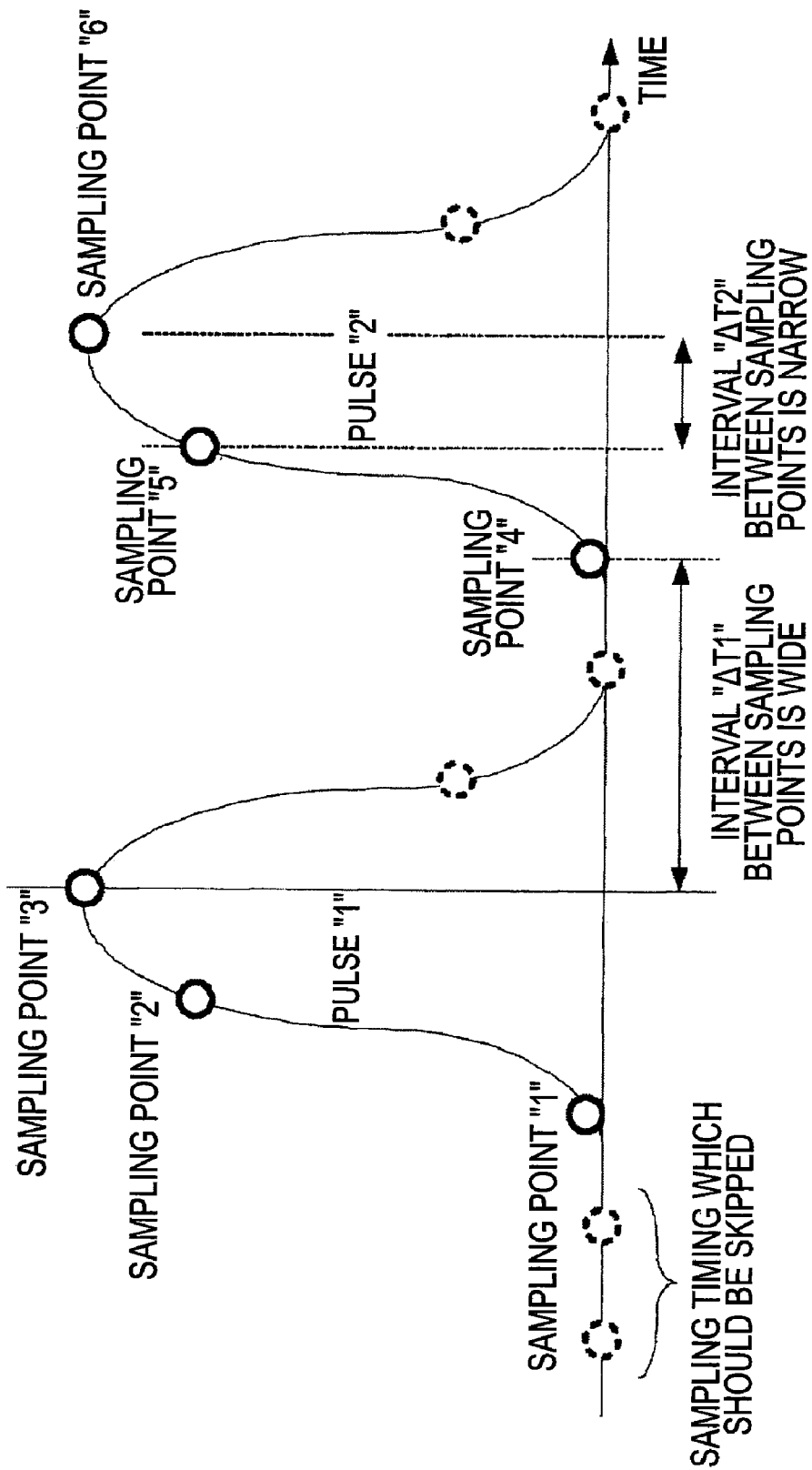
FIG. 13 is an explanatory diagram for explaining another operation example of a synchronizing apparatus according to another embodiment mode of the present invention.

As represented in FIG. 1, although the above-described description has been exemplified by employing the plurality of sampling unit 102 and 103, only one sampling unit may be alternatively employed. As shown in FIG. 13, even when the below-mentioned sampling operation is provided, a similar effect may be achieved. That is, while a single pulse may be sampled at a plurality of sampling points, and further, skipping sample timing (sampling operation is not performed, or sampled data is not employed in judgment) may be prepared, a portion ($\Delta t1$) where an interval between sampling points is wide may be provided, and another portion ($\Delta t2$) where an interval between sampling points is narrow may be provided.

Also, in FIG. 13, the description has been made of such a case that the plurality of sampling points are present with respect to the single pulse. Alternatively, in such a case that sampling operations for all of pulses are not required which are executed in a synchronous pull-in operation and a follow-up operation, an under sampling operation may be similarly carried out in which the sampling operation is carried out over a plurality of pulses.

Also, as represented in FIG. 2, the above-described operations have been described only in such a case that leading and retarding of the phases are judged so as to change the sampling timing every time the measuring operation is carried out. Alternatively, leading and retarding of the phases may be judged after the measuring operations thereof have been performed predetermined times. In other words, for instance, as shown in sampling points "1" to "6" of FIG. 13, measuring operations may be firstly carried out at a large number of sampling points, and thereafter, a judging process operation may be carried out with respect to the collected measured values. In FIG. 13, it is so judged that sampled values at the sampling points "3" and "6" are larger than sampled values of other sampling points. Then, since the sampling points "3" and "6" are compared with a pulse repetition period, it is possible to grasp that the sampling points "3" and "6" are sampling points with respect to the same phase for the pulse. As a result, this point is judged as the synchronous timing.

Embodiment Mode 2

In the embodiment mode 1, such a process operation has been carried out in which the intervals (Δt1, Δt2) during which two sets of the sampling unit 102 and 103 perform the sampling operations are changed in response to the synchronous status. In contrast to this process operation, in an embodiment mode 2, synchronous control operations based upon sampling results are formed in tables so as to perform a high-speed process operation.

Figure 4:
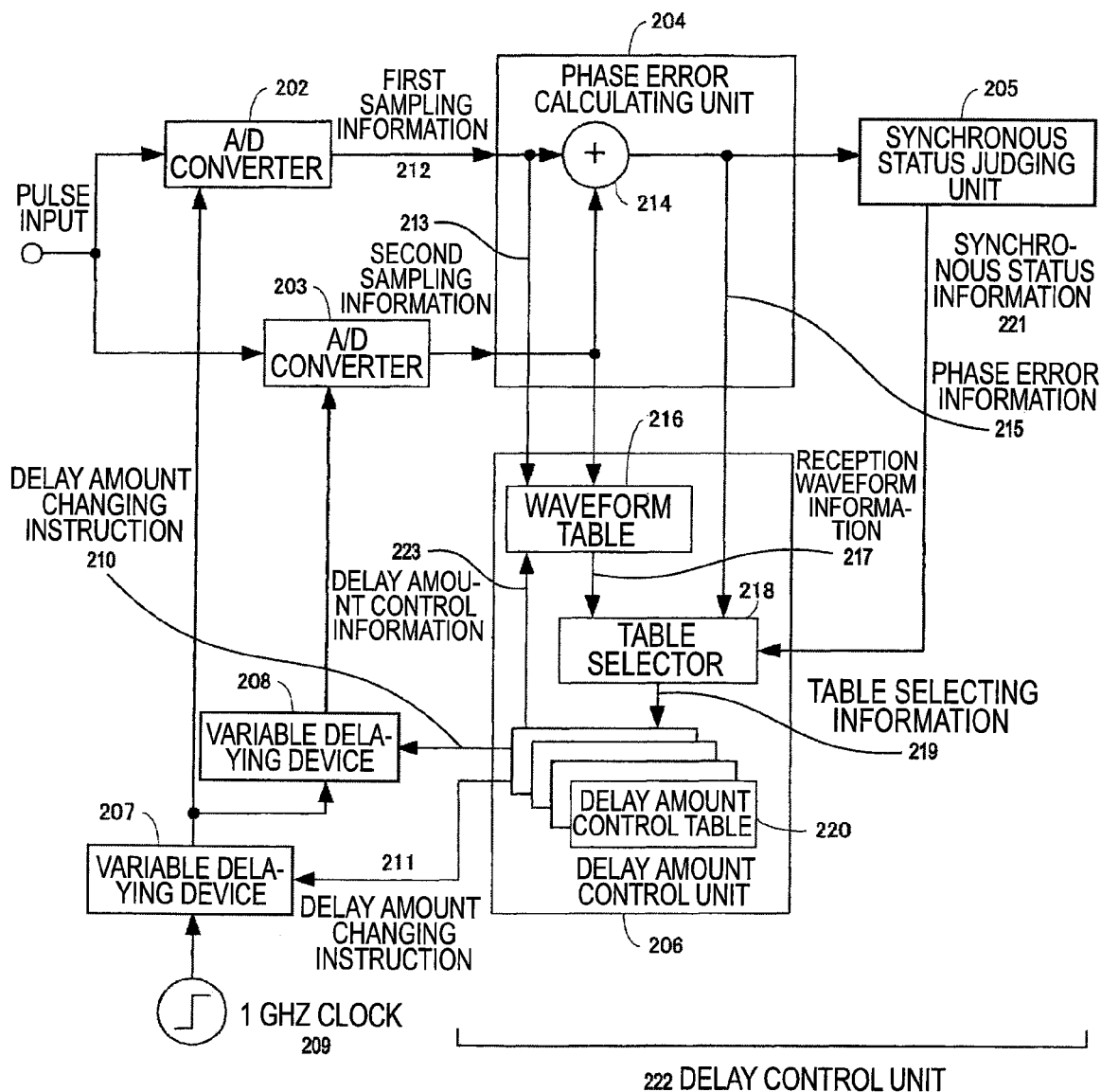
FIG. 4 is a block diagram for indicating an arrangement of a synchronizing apparatus according to an embodiment mode 2 of the present invention.

FIG. 4 is a block diagram for indicating a synchronizing apparatus. An inputted pulse signal 201 is sampled by two sets of A/D converters (sampling unit) 202 and 203 having different timing from each other, and a delay amount of a clock signal 209 is determined based upon a large/small relationship between amplitudes at these sampling points so as to control variable delaying derives 207 and 208. As this control operation, the relevant table is investigated based upon a difference value between the amplitudes at the sampling points so as to determine delay control amounts.

FIG. 5 indicates an example as to delay amount control tables. For example, in a table during a pull-in operation (high speed) shown at a left portion of FIG. 5, when an input value (namely, amplitude difference of sampling point "1" and sampling point "2") is large, an output value (delay control amount) has been set to be a large value, and since the clock signal is largely shifted, the input signal can be pulled into a synchronous status in a high speed. On the other hand, in a table after the pull-in operation (low speed) shown in a right portion of FIG. 5, even when an input value is large, an output value has been set to be a small value, and even in such a case that noise and jitter components are large, the synchronous status can be maintained.

As previously described, the different tables can be utilized in response to the synchronous statuses. As delay amount control tables 220 indicated in FIG. 4, for example, plural sorts of tables may be employed, for instance, a pull-in judgment table, a table during pull-in operation, a table after pull-in operation, and the like may be employed. A selection of the delay amount control tables 220 is performed by a table selector 218. Alternatively, a judgment result (table selecting information 219) of a waveform table 216 represented in the drawing may be employed as a parameter for selecting a delay amount control-purpose table.

Also, a phase error calculating unit 204 may alternatively contain a reference table in order to calculate a phase error. Also, a synchronous status judging unit 205 may contain a reference table for judging a synchronous status. As previously described, since the phase error calculating unit 204 calculates the phase error and the synchronous status judging unit 205 judges the synchronous status with reference to the tables, the respective process operations can be carried out in high speeds.

Figure 6:
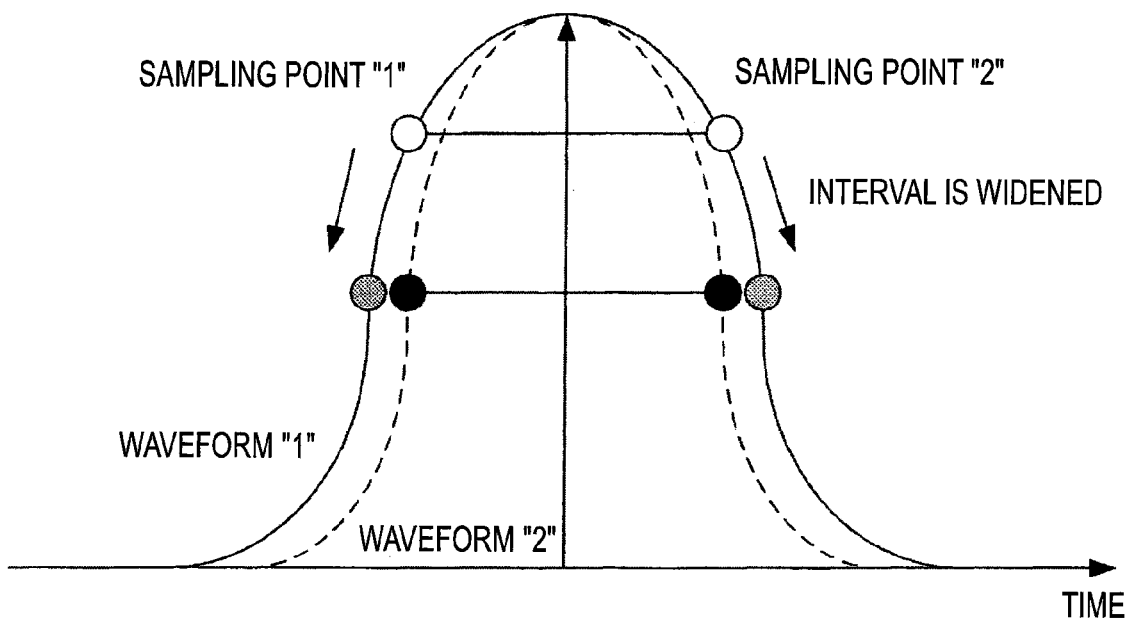
FIG. 6 is an explanatory diagram for explaining an operation example of the synchronizing apparatus according to the embodiment mode 2 of the present invention.
Figure 6:
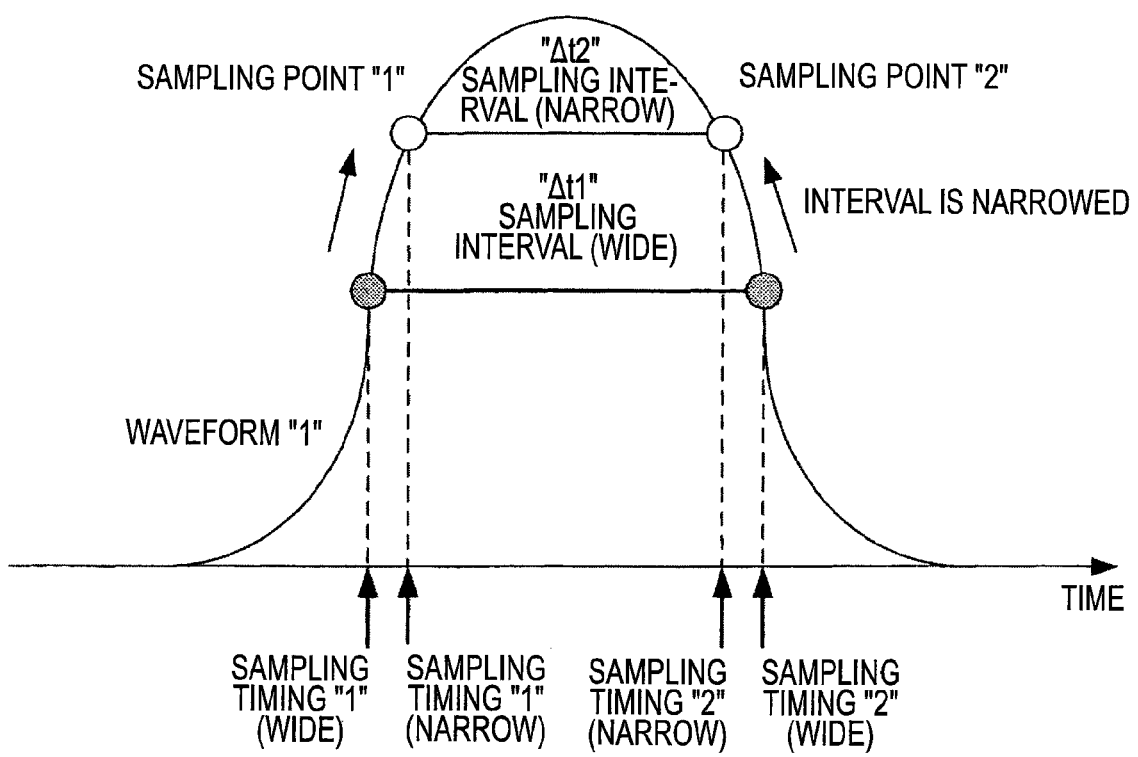

Referring to FIG. 6, a description is made of the reason why the waveform table 216 is employed. In the previous descriptions, the intervals between the sampling points have been set based upon the difference between the amplitude values of the two sampling points (sampling points "1" and "2") and the synchronous status. However, as indicated in FIG. 6(a), even when amplitude differences between the sampling point "1" and the sampling point "2" are equal to each other, the below-mentioned technical point has not been considered. That is, which waveform portions have been sampled with respect to a maximum amplitude of a waveform.

For example, if a waveform "2" indicated by a dot line is sampled at sampling points denoted by black circles, then the waveform portions located in the vicinity of an intermediate portion of a maximum amplitude thereof are sampled. However, if a received waveform corresponds to another waveform "1" indicated by a solid line, then sampling points constitute sampling points indicated by white circles. In other words, since this sampling operation implies that higher amplitude portions are acquired with respect to the maximum amplitude, in order to sample the waveform portions located similar to the above-described intermediate waveform portions, an interval therebetween must be widened to constitute sampling points indicated by an oblique line.

In other words, delay amounts set based upon waveforms are different from each other, so that different tables must be investigated. As a consequence, since first sampling information 212 of the ND converter 202, second sampling information 213 of the ND converter 203, and the delay amount control information 223 of the delay amount control table 220 are inputted to the waveform table 216, a waveform is predicted and the predicted waveform is employed in order to select a proper table.

Figure 7:
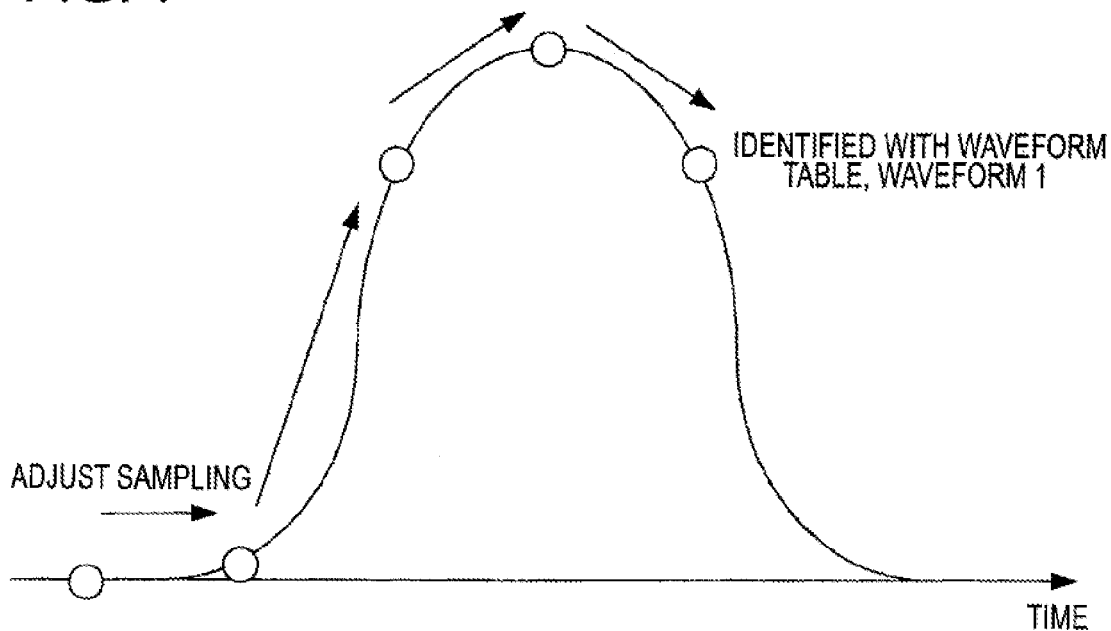
FIG. 7 is an explanatory diagram for explaining a waveform predicting operation example of the synchronizing apparatus according to the embodiment mode 2 of the present invention.
Figure 8:
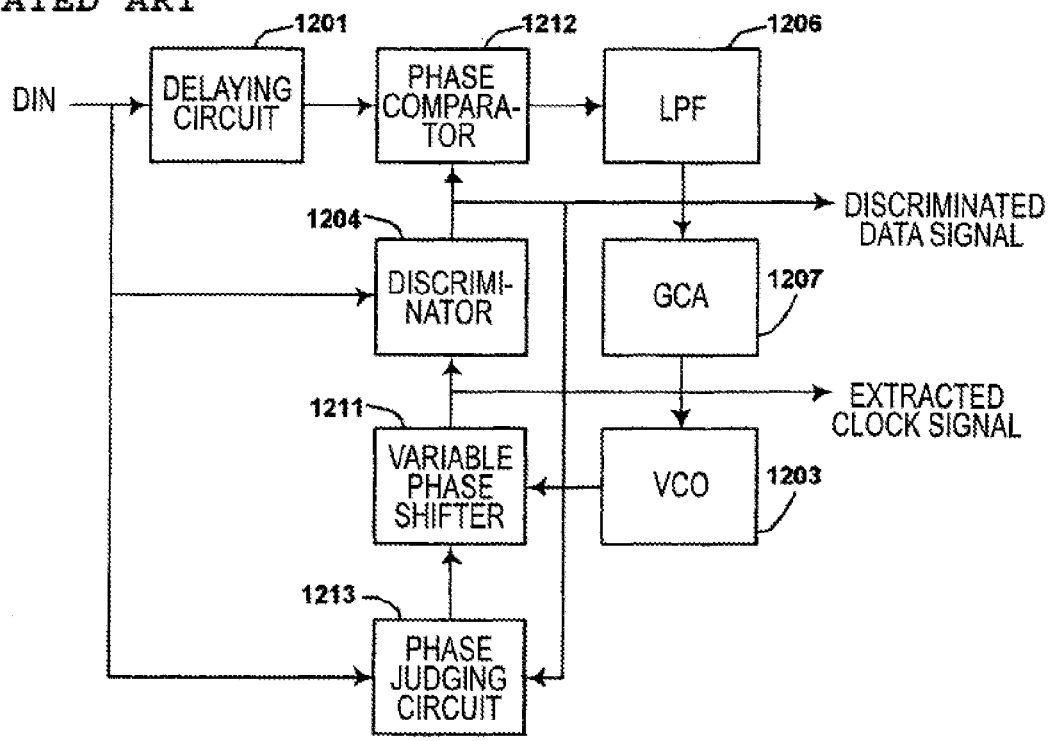
FIG. 8 is a block diagram for representing the arrangement of the conventional clock data recovery circuit.
Figure 9:
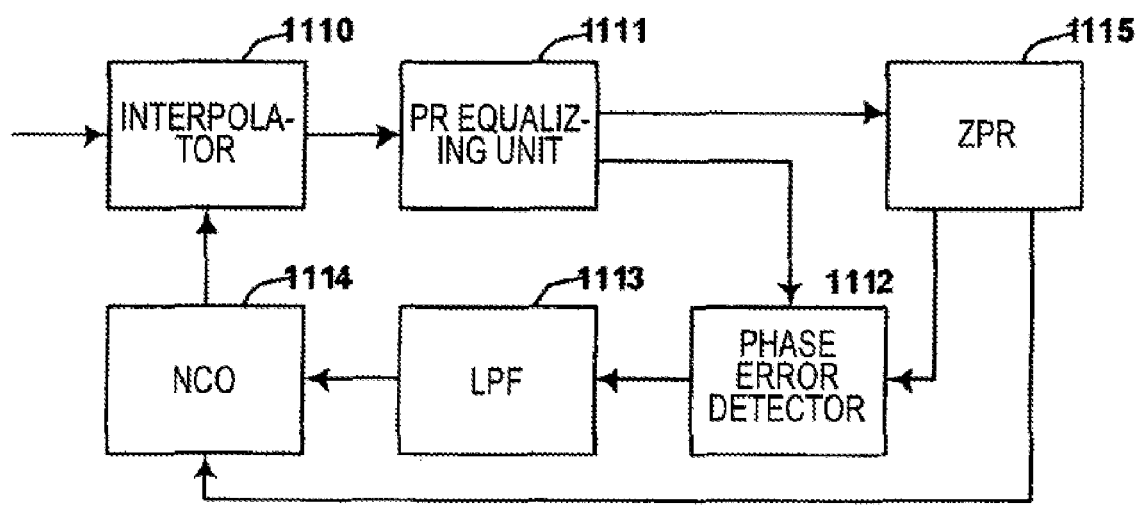
FIG. 9 is a block diagram for indicating the arrangement of the conventional synchronizing apparatus.
Figure 10:
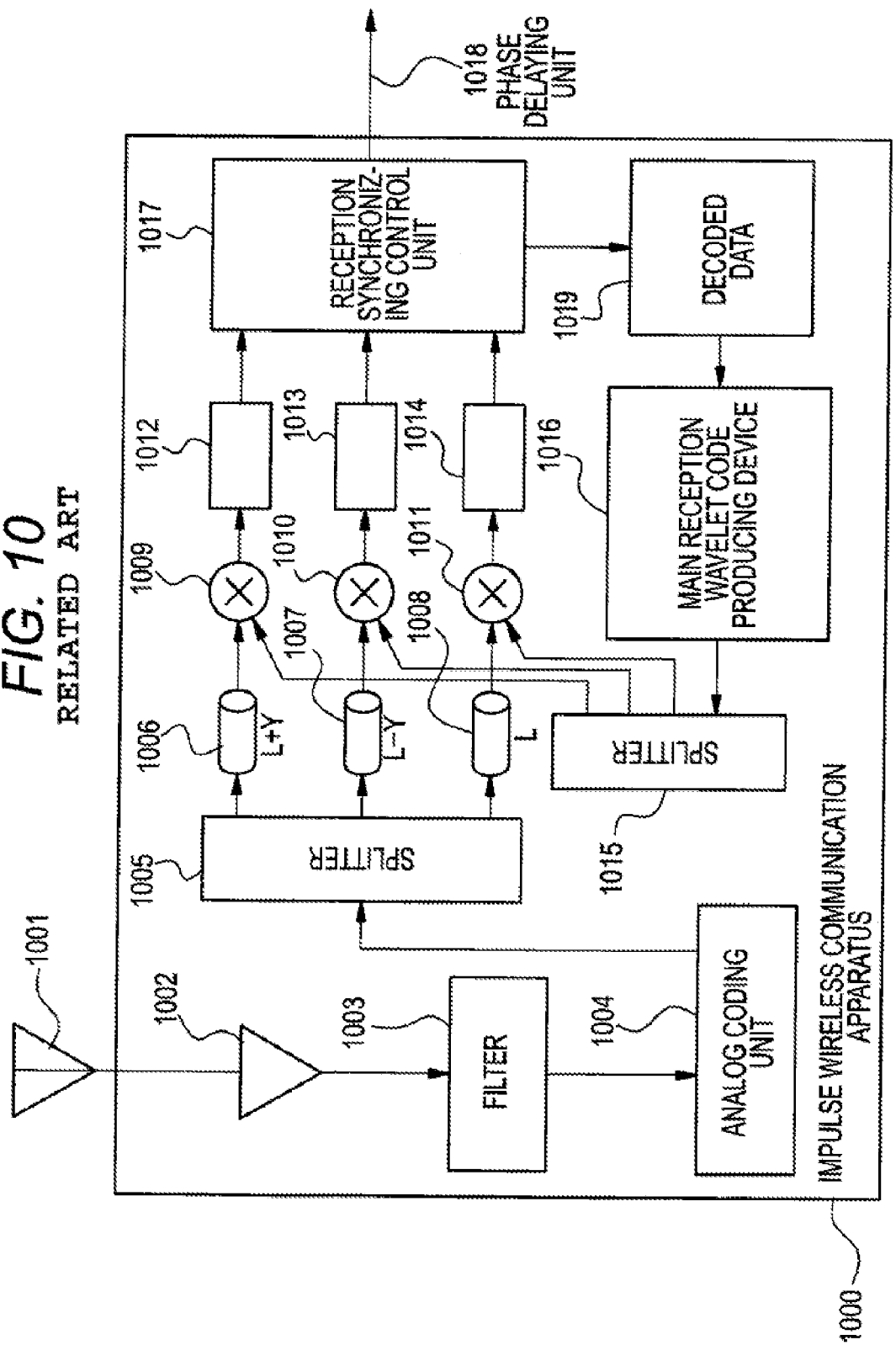
FIG. 10 is a block diagram for indicating the arrangement of the conventional pulse signal-purpose synchronizing apparatus.

FIG. 7 represents one example as to predictions of waveforms. In a synchronizing circuit, when a pull-in operation is carried out, a sampling position is adjusted. In this case, amplitudes at a plurality of portions of a waveform are sampled. Since the sampled amplitudes and the adjusted delay amount are employed, a waveform predicting operation is carried out. It should also be noted that when the waveform predicting operation is carried out based upon the amplitudes of the respective points, a correlation thereof with respect to a previously prepared waveform table may be calculated so as to predict the nearmost waveform, and then, the waveform table may be alternatively employed.

Figure 12:
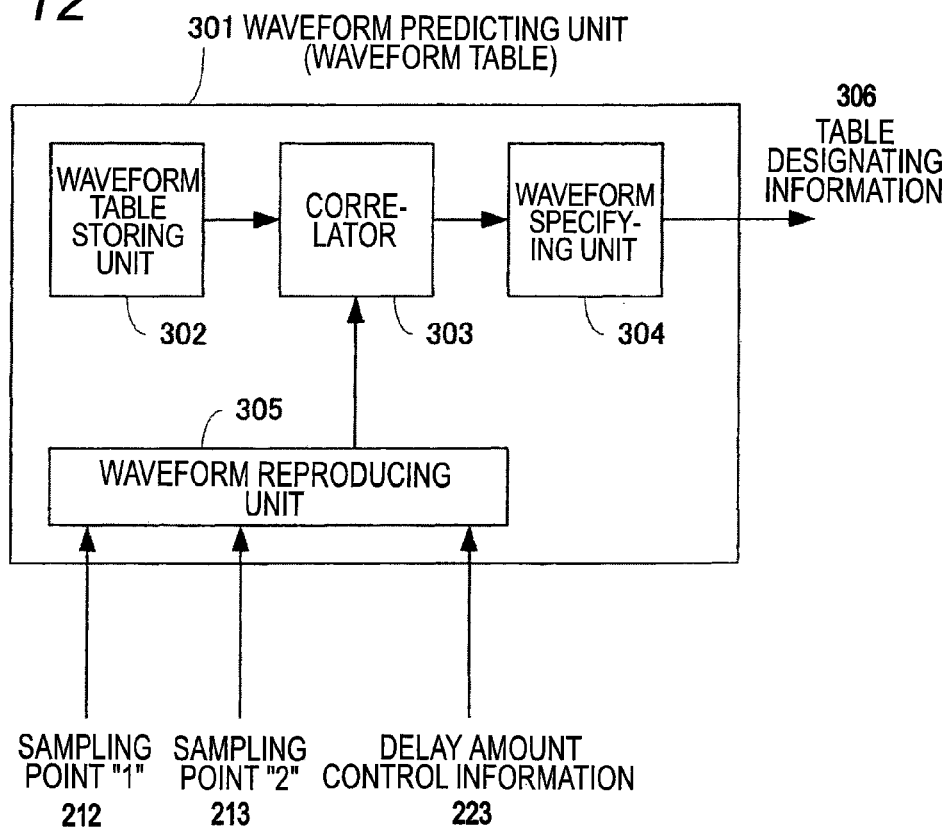
FIG. 12 is a block diagram for indicating an arrangement of a waveform predicting unit (waveform table) according to the embodiment mode 2 of the present invention.

FIG. 12 represents an example as to a block arrangement of a waveform predicting unit 301 (corresponding to waveform table 216 shown in FIG. 4). While the waveform predicting unit 301 has a function for predicting a waveform, the waveform predicting unit 301 predicts a waveform based upon both the amplitude information (first sampling information 212 and second sampling information 213) of the sampling points "1" and "2", and the delay amount control information 223, and then, the waveform to be predicted is reproduced by a waveform predicting unit 305.

Since correlations with respect to the waveform information stored in this waveform table storing unit 302 are acquired by a correlator 303, such a waveform having the highest correlation stored in the waveform table storing unit 302 is extracted so as to predict a waveform of a pulse under reception. The waveform is specified by comparing the correlations with each other by a waveform specifying unit 304. The waveform information acquired in this operation is employed so as to select a delay amount control table. Since the above-described arrangement is made, such a synchronizing apparatus capable of establishing a synchronization within a short time can be realized with employment of a simple arrangement.

More specifically, after the synchronous status has been judged, a waveform under synchronous status is predicted based upon the amplitude information of the sampling points "1" and "2", and the delay amount control information, which have been acquired during the synchronous pull-in operation; and as shown in FIG. 6(b), a sampling interval is narrowed from "Δt1" to "Δt2" by controlling the delay amounts to the variable delaying devices 107 and 108, so that synchronous jitter components can be suppressed to become a small component.

It should also be understood that no description has been made of a sampling number employed in the above-described waveform predicting operation. Alternatively, even when all of the sampling numbers may be employed, or 3 or more pieces of sampling numbers may be employed, the waveform may be predicted. Otherwise, the waveform may be predicted based upon an inclination of a waveform by employing two sampling points.

Also, a difference between a present sampling position and a sampling point at a synchronous point may be alternatively detected from predicted waveform information so as to change the delay amount adjusting amount of the variable delaying device which controls the delay amount of the reference signal clock. As a changing method, if a shift between a present sampling point and the synchronous point is large, then the adjusting amount may be increased, whereas if a shift between a present sampling point and the synchronous point is small, then the adjusting amount may be decreased. As a consequence, when the above-described shift is large, this shift may be controlled in a coarse manner in order that the delay amount adjusting amount is quickly approximated to the optimum synchronous point, and thereafter, when the shift becomes small, the delay amount adjusting point is controlled in a fine manner, so that the synchronous jitter components may be suppressed to a small value.

Alternatively, similar to the delay amount adjusting amount, a difference between a present sampling position and a sampling point at a synchronous point may be alternatively detected from predicted waveform information so as to change the delay amount adjusting amount of the variable delaying device, and also to change a total number of pulses for controlling the variable delay amount, namely, the averaging number.

As the changing methods, if a shift between a present sampling point and the synchronous point is large, then the averaging number may be decreased, whereas if a shift between a present sampling point and the synchronous point is small, then the averaging number may be increased. As a consequence, when the above-described shift is large, this shift may be controlled in a coarse manner in order that the delay amount adjusting amount is quickly approximated to the optimum synchronous point, and thereafter, when the shift becomes small, the delay amount adjusting point is controlled in a fine manner, so that the synchronous jitter components may be suppressed to a small value.

Also, in the above-described explanation, only such an operation has been described that the synchronous timing is coincident by employing the sampled amplitude values. Alternatively, a waveform may be predicted based upon a plurality of sampled values in accordance with the above-explained method so as to predict a maximum amplitude of a reception signal, and thus, the predicted maximum amplitude may be employed in transmission and reception control operations. As the transmission and reception control operations, a gain control (AGC control) operation of a reception amplifier, a transmission signal power control operation, and the like may be conceived.

Further, in the above-explained descriptions, no description has been made as to when the reference tables are set. For instance, the reference tables may be set at a factory shipping stage, or may be alternatively set in response to a sequence to be received. Also, a deformation of a waveform may be alternatively predicted by utilizing the known portion of the reception signal, and then, the reference tables may be alternatively changed based upon the predicted waveform deformation.

Although the present invention has been described in detail, or with reference to the specific embodiment modes, it is obvious for ordinarily skilled engineers to conceive such a fact that the present invention can be modified and changed in various manners without departing from the technical scope and spirit of the present invention.

The present application claims priority from Japanese Patent application (JP-A-2006-335737) filed on Dec. 13, 2006, and Japanese Patent application (JP-A-2007-245829) filed on Sep. 21, 2007, the contents of which are hereby incorporated by reference into this application.

INDUSTRIAL APPLICABILITY

The present invention has an advantage capable of providing the wireless apparatus such as the synchronizing apparatus, in which even when the synchronous status is varied due to the variation in the pulse shapes, both the sampling timing and the interval therebetween can be controlled in response to the synchronous statuses, so that the pulse widths can be sampled at the proper positions; and the signal variable delaying unit is controlled based upon the information acquired from the data sampling unit with respect to the inputted signal so as to synchronize the sampling timing with each other.

The invention claimed is:

1. A wireless apparatus comprising:
a sampling unit for sampling an input signal in accordance with a plurality of different intervals from each other, said sampling unit comprises:
a first sampling unit for sampling said input signal at first sampling timing; and
a second sampling unit for sampling said input signal at second sampling timing;
a variable delaying device for changing said plurality of sampling intervals, said variable delaying device comprises:
a first variable delaying device for delaying a clock signal in response to a signal derived from a delay amount control unit so as to produce said first sampling timing; and
a second variable delaying device for delaying said first sampling timing in response to a signal derived from said delay amount control unit so as to produce said second sample timing;
a phase error calculating unit for calculating a phase error by employing an amplitude difference among a plurality of sampled values sampled by said sampling unit;
a synchronous status judging unit for judging a synchronous status by employing the phase error calculated by said phase error calculating unit; and
said delay amount control unit for changing a delay amount of said variable delaying device based upon both the phase error calculated by said phase error calculating unit and the synchronous status judged by said synchronous status judging unit, wherein said delay amount control unit comprises a plurality of waveform tables corresponding to a waveform of said input signal, said delay amount control unit predicts the waveform of said input signal so as to select a predetermined waveform table corresponding to the waveform of said input signal, and refers to the selected waveform table so as to control said first sampling timing and said second sampling timing,
wherein said phase error calculating unit calculates said phase error by detecting an amplitude difference between a first sampled value sampled by said first sampling unit, and a second sampled value sampled by said second sampling unit, said delay amount control unit changes the delay amounts of said first and second variable delaying devices based upon the phase error calculated by said phase error calculating unit and the synchronous status judged by said synchronous status judging unit, and said delay amount control unit comprises a waveform predicting unit which defines the amplitude information acquired at said first and second sampling timing as a parameter of the prediction, said waveform predicting unit is arranged by:

a waveform table storing unit for storing thereinto waveform information which has been previously prepared;

a waveform reproducing unit for reproducing a prediction-purpose waveform based upon the amplitude information and temporal information of said input signal;

a correlation acquiring unit for acquiring a correlation between the waveform information stored in said waveform table storing unit and said waveform reproduced by said waveform reproducing unit; and a waveform specifying unit for specifying a waveform based upon the correlative result obtained in said correlation acquiring unit so as to output table designation information for designating a table which is investigated in the delay amount control operation, wherein the temporal information of said input signal is a delay amount when said clock signal is delayed by said first and second variable delaying devices.

2. The wireless apparatus as claimed in claim 1 wherein:

said sampling unit samples said input signal at said first sampling timing and said second sampling timing, which are separated from each other in a predetermined interval; and said delay amount control unit shifts at least one of said first and second sampling timing during a synchronous pull-in operation, and narrows the interval between said first and second sampling timing during a synchronous follow-up operation.

3. The wireless apparatus as claimed in claim 1 wherein:

said sampling unit samples said input signal at said first sampling timing and said second sampling timing separated from each other in the predetermined interval by thinning a sampling point.

4. The wireless apparatus as claimed in claim 3, wherein:

said phase error calculating unit calculates said phase error by detecting an amplitude difference between said first sampled value sampled at said first sampling timing, and said second sampled value sampled at said second sampling timing; and wherein:

said delay amount control unit changes at least any one of said first sampling timing and said second sampling timing based upon the phase error calculated by said phase error calculating unit and the synchronous status judged by said synchronous status judging unit.

5. The wireless apparatus as claimed in claim 1, or claim 4 wherein:

said phase error calculating unit is comprised of a first table which is investigated so as to calculate the phase error.

6. The wireless apparatus as claimed in claim 1, or claim 4 wherein:

said synchronous status judging unit is comprised of a second table which is investigated so as to judge the synchronous state.

7. The wireless apparatus as claimed in claim 1, or claim 4 wherein: said delay amount control unit is comprised of a third table which is investigated so as to determine the delay amount.

8. The wireless apparatus as claimed in claim 1 wherein:

during the synchronous follow-up operation, said delay amount control unit refers to the selected waveform table so as to narrow the interval between said first sample timing and said second sample timing.

9. The wireless apparatus as claimed in claim 1, or claim 4 further comprising:

a reception power calculating unit for calculating reception power based upon the output result of said phase error calculating unit.

10. The wireless apparatus as claimed in claim 1, or claim 4 wherein:

said phase error calculating unit calculates the phase error based upon said first sampled values and said second sampled values, which have been sampled predetermined times; and said synchronous status judging unit judges the synchronous status every time said phase error calculating unit calculates the phase error.

11. A wireless apparatus comprising:

a sampling unit for sampling an input signal in accordance with a plurality of different intervals from each other, said sampling unit comprises:

a first sampling unit for sampling said input signal at first sampling timing; and a second sampling unit for sampling said input signal at second sampling timing;

a variable delaying device for changing said plurality of sampling intervals, said variable delaying device comprises:

a first variable delaying device for delaying a clock signal in response to a signal derived from a delay amount control unit so as to produce said first sampling timing; and a second variable delaying device for delaying said first sampling timing in response to a signal derived from said delay amount control unit so as to produce said second sample timing;

a phase error calculating unit for calculating a phase error by employing an amplitude difference among a plurality of sampled values sampled by said sampling unit;

a synchronous status judging unit for judging a synchronous status by employing the phase error calculated by said phase error calculating unit; and said delay amount control unit for changing a delay amount of said variable delaying device based upon both the phase error calculated by said phase error calculating unit and the synchronous status judged by said synchronous status judging unit, wherein said delay amount control unit comprises a plurality of waveform tables corresponding to a waveform of said input signal, said delay amount control unit predicts the waveform of said input signal so as to select a predetermined waveform table corresponding to the waveform of said input signal, and refers to the selected waveform table so as to control said first sampling timing and said second sampling timing, wherein said delay amount control unit comprises a waveform predicting unit which defines the amplitude information acquired at said first and second sampling timing as a parameter of the prediction wherein said waveform predicting unit is arranged by:
  a waveform table storing unit for storing thereinto waveform information which has been previously prepared;
  a waveform reproducing unit for reproducing a prediction-purpose waveform based upon the amplitude information and temporal information of said input signal;
  a correlation acquiring unit for acquiring a correlation between the waveform information stored in said waveform table storing unit and said waveform reproduced by said waveform reproducing unit; and
  a waveform specifying unit for specifying a waveform based upon the correlative result obtained in said correlation acquiring unit so as to output table designation information for designating a table which is investigated in the delay amount control operation.

12. The wireless apparatus as claimed in claim 11 wherein:
  said waveform specifying unit changes a table to be selected in response to a sequence of said input signal.

* * * * *